US012748474B2

(12) United States Patent
Kolovos et al.

(10) Patent No.: US 12,748,474 B2
(45) Date of Patent: Sep. 29, 2026

(54) AUTOMATIC CIRCUIT ALLOCATION OF REMOTE DEVICES IN A MULTI-POWER SUPPLY SYSTEM

(71) Applicant: RAYCAP, S.A., Maroussi (GR)

(72) Inventors: Anestis Kolovos, Maroussi (GR); Charalampos Vogiatzakis, Maroussi (GR); Theodoros Mouselinos, Maroussi (GR); George Vassilakis, Maroussi (GR); Shawn A. Warner, Maroussi (GR); Michael C. Bloxham, Maroussi (GR)

(73) Assignee: RAYCAP, S.A., Maroussi (GR)

( * ) Notice: Subject to any disclaimer, the term of this patent is extended or adjusted under 35 U.S.C. 154(b) by 0 days.

(21) Appl. No.: 19/320,402

(22) Filed: Sep. 5, 2025

(65) Prior Publication Data

US 2026/0003410 A1 Jan. 1, 2026

Related U.S. Application Data

(63) Continuation of application No. 19/264,498, filed on Jul. 9, 2025, which is a continuation of application No. 18/170,460, filed on Feb. 16, 2023, now Pat. No. 12,379,760.

(60) Provisional application No. 63/314,816, filed on Feb. 28, 2022.

(51) Int. Cl.

| | |
|---|---|
| ***G06F 1/26*** | (2006.01) |
| ***H02M 1/32*** | (2007.01) |
| ***H02M 3/158*** | (2006.01) |
| ***H05K 7/14*** | (2006.01) |

(52) U.S. Cl.
CPC ............ *G06F 1/263* (2013.01); *H02M 1/325* (2021.05); *H02M 3/158* (2013.01); *H05K 7/14322* (2022.08); *H05K 7/14324* (2022.08)

(58) Field of Classification Search
CPC ....... G06F 1/263; H02M 1/325; H02M 3/158; H05K 7/14322; H05K 7/14324; H04B 3/548; H04M 19/008; G01R 19/2513
See application file for complete search history.

(56) References Cited

U.S. PATENT DOCUMENTS

| | | | | |
|---|---|---|---|---|
| 9,057,862 | B2 * | 6/2015 | Strasser ............... | H02G 15/117 |
| 9,099,860 | B2 | 8/2015 | Martinez et al. | |
| 9,448,576 | B2 | 9/2016 | Chamberlain et al. | |

(Continued)

OTHER PUBLICATIONS

International Search Report and Written Opinion issued in PCT Application No. PCT/IB2023/000107 dated Jul. 12, 2023; 12 pages.

*Primary Examiner* — Brian T Misiura
(74) *Attorney, Agent, or Firm* — Amster, Rothstein & Ebenstein LLP

(57) ABSTRACT

A power transmission system is disclosed comprising a centralized power supply system having multiple DC power supply units and a controller coupled to the DC power supplies. Remote devices are coupled to the centralized power system via a power cable. In some embodiments, the DC power supply units transmit signal information to respective ones of the remote devices, and the remote devices may be configured to forward the signal information to the controller. In some embodiments, the controller module automatically allocates individual ones of the DC power supply units to the respective ones of the remote devices based on the forwarded signal information.

30 Claims, 4 Drawing Sheets

(56) References Cited

U.S. PATENT DOCUMENTS

| | | | | |
|---|---|---|---|---|
| 10,025,335 | B2 | 7/2018 | Chamberlain et al. | |
| 10,128,685 | B2 * | 11/2018 | Hanley | H02J 9/061 |
| 10,281,939 | B2 * | 5/2019 | Chamberlain | G01R 27/16 |
| 10,423,180 | B2 | 9/2019 | Chamberlain et al. | |
| 10,782,720 | B2 | 9/2020 | Guerin et al. | |
| 10,812,664 | B2 | 10/2020 | Kostakis et al. | |
| 10,912,025 | B2 | 2/2021 | Coleman et al. | |
| 10,971,925 | B2 | 4/2021 | Lebon et al. | |
| 11,129,095 | B2 | 9/2021 | Gandhi | |
| 11,505,748 | B2 | 11/2022 | Mesnil | |
| 2015/0234399 | A1 | 8/2015 | Chamberlain et al. | |
| 2019/0377394 | A1 | 12/2019 | Klaba | |
| 2020/0213940 | A1 | 7/2020 | Gandhi | |
| 2021/0072779 | A1 | 3/2021 | Guerin et al. | |
| 2023/0276592 | A1 | 8/2023 | Vogiatzakis et al. | |

* cited by examiner

AUTOMATIC CIRCUIT ALLOCATION OF REMOTE DEVICES IN A MULTI-POWER SUPPLY SYSTEM

CROSS-REFERENCE TO RELATED APPLICATIONS

This application is a continuation application of U.S. application Ser. No. 19/264,498 filed Jul. 9, 2025, which is a continuation application of U.S. application Ser. No. 18/170,460 filed Feb. 16, 2023, which claims the benefit of Provisional Patent Application Ser. No. 63/314,816, filed Feb. 28, 2022, and assigned to the assignee of the present application.

COPYRIGHT NOTICE

A portion of the disclosure of this patent document contains material that is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

TECHNICAL FIELD

One or more implementations relate generally to a multi-power supply systems, and in particular to automatic circuit allocation of remote devises in a multi-power supply system.

BACKGROUND

There are many applications where multiple devices (loads) are located remotely to a central location where a power supply system is installed. These devices may have different power requirements and characteristics and as a result require independent power supply characteristics to power them. This is typically implemented using several power supply units controlled by a central unit, where the controller unit could modify the power characteristics of each power supply unit according to the requirements of each remote device that will feed.

However, due to the remote location of the devices and to their high number, installation errors may occur which will affect the correspondence between power supply units and equivalent devices. This will result that a device with a specific set of power requirements will be fed by a power supply of inappropriate power characteristics, intended to be allocated and used by a different device.

One way to secure that there is a proper allocation of the power supplies to the corresponding remote devices is to manually check the continuity of the power conductors or switch on and off the power supply outputs and observe if the corresponding remote device will operate. However, this is a complicated procedure, especially if the remote devices are distant from each other.

BRIEF DESCRIPTION OF THE DRAWINGS

The included drawings are for illustrative purposes and serve to provide examples of possible structures and operations for the disclosed inventive systems, apparatus, methods and computer-readable storage media. These drawings in no way limit any changes in form and detail that may be made by one skilled in the art without departing from the spirit and scope of the disclosed implementations.

DETAILED DESCRIPTION

Broadly, the disclosed embodiments relate to an automated method of performing circuit allocation in a multi-output, centralized power supply system that powers several remote devices or loads. The embodiments disclose outputting power from multiple DC power supplies to corresponding remote devices, and using power feedback information to perform automatic allocation of the DC power supplies to the remote devices.

Figure 1A:
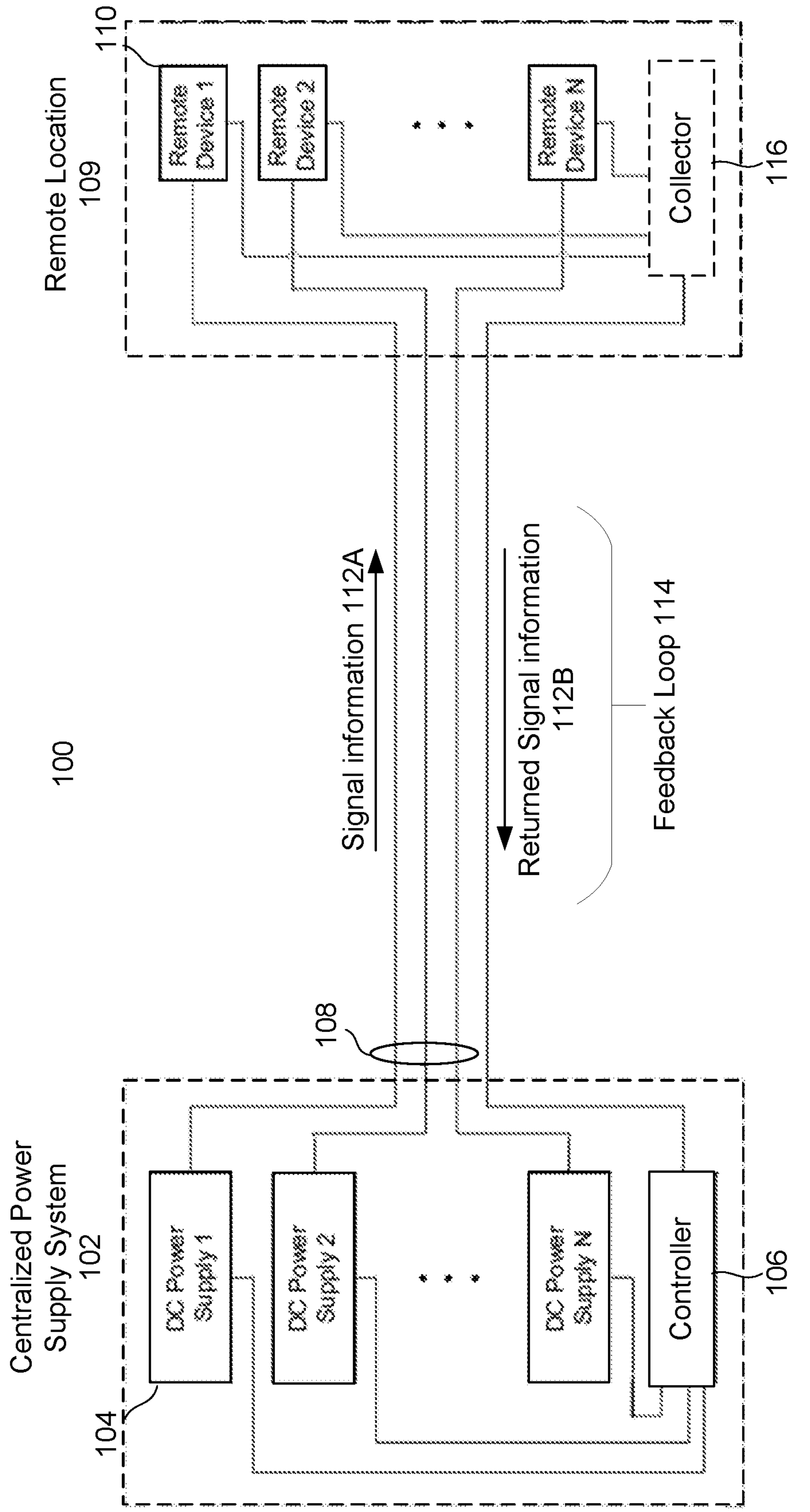
FIG. 1A is a block diagram illustrating of a power transmission system for automatically allocating multiple DC power supplies to multiple remote devices.

FIG. 1A is a block diagram illustrating of a power transmission system for automatically allocating multiple DC power supplies to multiple remote devices. In one embodiment, the power transmission system 100 comprises a centralized power supply system 102 having multiple DC power supply units 104 and a controller 106 coupled to the DC power supply units 104. The centralized power supply system 102 powers remote devices 110 in a location remote from the centralized power supply system 102, and the remote devices 110 may impart different loads on the centralized power supply system. Because the centralized power supply system 102 uses multiple DC power supply units 104, the centralized power supply system 102 may be referred to as a multi-output power supply system.

In a wired embodiment, an optional power cable 108 is coupled at one end to the DC power supply units 104, and is coupled at the other end in remote location 109 to the remote devices 110. As used herein, the remote devices may refer to any electronic device manufactured for a specific purpose that operates under power from a distance over a wired connection. Examples of remote devices may include, but is not limited to, sensors, motors, IoT devices, radios, and the like.

Figure 1B:
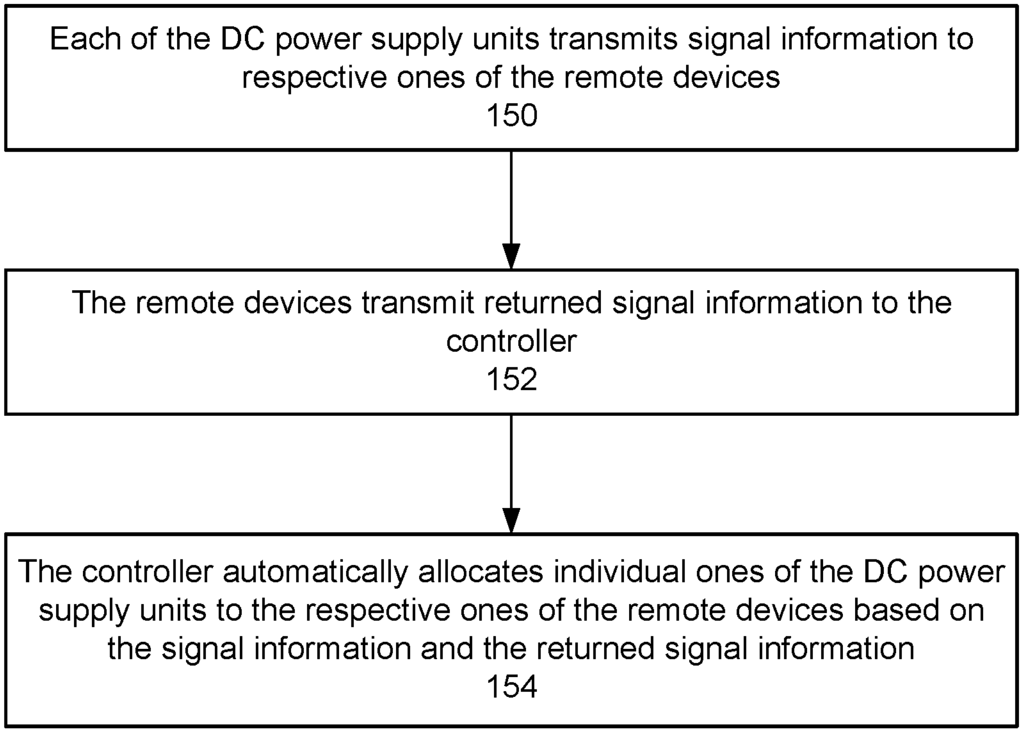
FIG. 1B is a flow diagram illustrating a process performed by the components comprising the power transmission system.

FIG. 1B is a flow diagram illustrating a process performed by the components comprising the power transmission system 100. Referring to both FIGS. 1A and 1B, the process may begin by each of the DC power supply units 104 transmitting signal information 112 to respective ones of the remote devices 110 (block 150). In one embodiment, the controller 106 may instruct the DC power supply units 104 to transmit the signal information 112 upon initiation of the centralized power supply system 102 or the DC power supply units 104. Responsive to receiving the signal information 112, the remote devices 110 may be configured to transmit returned signal information 112B to the controller 106 (block 152).

According to the disclosed embodiments, responsive to receiving the returned signal information 112B, the controller 106 automatically allocates individual ones of the DC power supply units 104 to the respective ones of the remote devices 110 based on the signal information 112A and the returned signal information 112B (block 154).

In one embodiment, a feedback loop 114 between the centralized power supply system 102 and the remote devices

110 provides the signal information 112A to each of the remote devices, and provides the returned signal information 112B from the remote devices 110 to the controller 106. The returned signal information 112B may be same or different from the signal information 112A. The signal information 112A and the returned signal information 112B may be referred to collectively as signal information 112.

The signal information 112A may comprise any type of distortion in the output of the DC power supply units. For example, the signal information 112A may comprise any type of distortion in an output of the DC power supply units, noise applied to a voltage of the output of the DC power supply units, a switching on and off of the output of the DC power supply units, a high frequency signal injected to the output of the DC power supply units, or a voltage pulse applied to the output of the DC power supply units, or a combination thereof.

In the embodiment above, the remote device 110 receives the signal information 112A from the output of one of the DC power supply units 104 and transmits the returned signal information 112B to the controller 106 through the feedback loop 114. In this embodiment, the returned signal information 112B may comprise the same type of distortion comprising the signal information 112A, but applied to an output of the remote devices 110. In an alternative embodiment, the remote device 110 may first process the signal information 112A and then transmit the returned signal information 112B as a presence signal (e.g., sending an on or off dual state response) to notify the controller 106 that it received the signal information 112A. Consequently, the returned signal information 112B transmitted by the remote devices 110 enables the controller 106 to identify which one of the remote devices 110 received the signal information 112A from which DC power supply unit 104.

The feedback loop 114 that transfers information between the centralized power supply system 102 and the remote location 109 could be implemented individually for each remote device 110 and the controller 106 either through a wired connection or through a wireless connection or through a fiber optic connection.

In a further implementation, the system 100 may further include an optional device at the remote location, referred to a collector device 116, which concentrates or collects all the returned signal information 112B from the remote devices 110. The collector device 116 may then transmit the all the returned signal information 112B to the controller 106 over a single wired or wireless connection (or through fiber optic connection). This communication may be done through any suitable communication protocol, such as for example, RS485, Modbus or the like. The same communication systems could also be used by the individual remote devices in the embodiment where there is no collector.

Use of signal information 112 enables the controller 106 of the centralized power supply system 102 to identify which ones of the DC power supply units 104 are connected to which ones of the remote device 110. This enables the controller 106 to generate a mapping between the DC power supply units 104 and the remote devices 110 to which the DC power supply units 104 are connected.

Thereafter, the controller 106 may modify power characteristics of the individual DC power supply units 104 to match the power requirements of the corresponding remote devices 110. Alternatively, the controller 106 may inform an installer (via a display device or electronic communication) about possible incorrect correspondence between a DC power supply unit 104 and the connected remote device and could correct the installation.

In embodiments, the automated circuit allocation is started and performed by the controller 106 during an initialization phase of the centralized supply system (rather than during the powering and operation of the remote devices 110), or responsive to a command input of a user.

In one implementation, the automatic circuit allocation may be implemented such that each of the DC power supply units 104 sends the signal information 112A through a power output, one DC supply unit at a time. Then the remote device 110 receives this signal and uses the feedback loop 114 to send the returned signal information 112B to the controller 106 to enable it to identify which remote device received the information signal. Performing this process on all power supply units 104 enables the mapping the DC power supply units 104 and the remote devices 110.

In another implementation, the remote devices 110 may transmit the returned signal information 112B by introducing an increased demand in power (for example through additional current conduction), practically introducing the returned signal information 112B on the current conducted through this circuit. This action is triggered by original signal information 112A sent over the feedback loop 114 by the controller 106. Either the controller 106 or the DC power supply unit 104 connected to this remote device 110 may be configured to sense the returned signal information 112B (e.g., through current measurements or other type of sensors). If the DC power supply unit 104 senses the returned signal information 112B, then the DC power supply unit 104 may either provide this information to the controller 106 or notify the controller 106 which one of the DC power supply units 104 transmitted the returned signal information 112B.

The circuit used to by the DC power supply units 104 to generate the signal information 112A or the circuit used by the remote devices 110 to generate the returned signal information 112B could be either internal or external to the DC power supply units 104 or the remote devices 110. The controller 106 could be, in whole or in part, internal or external to the centralized power supply system. Further, the controller could also be in whole or in part internal to the individual power supply units.

Figure 2:
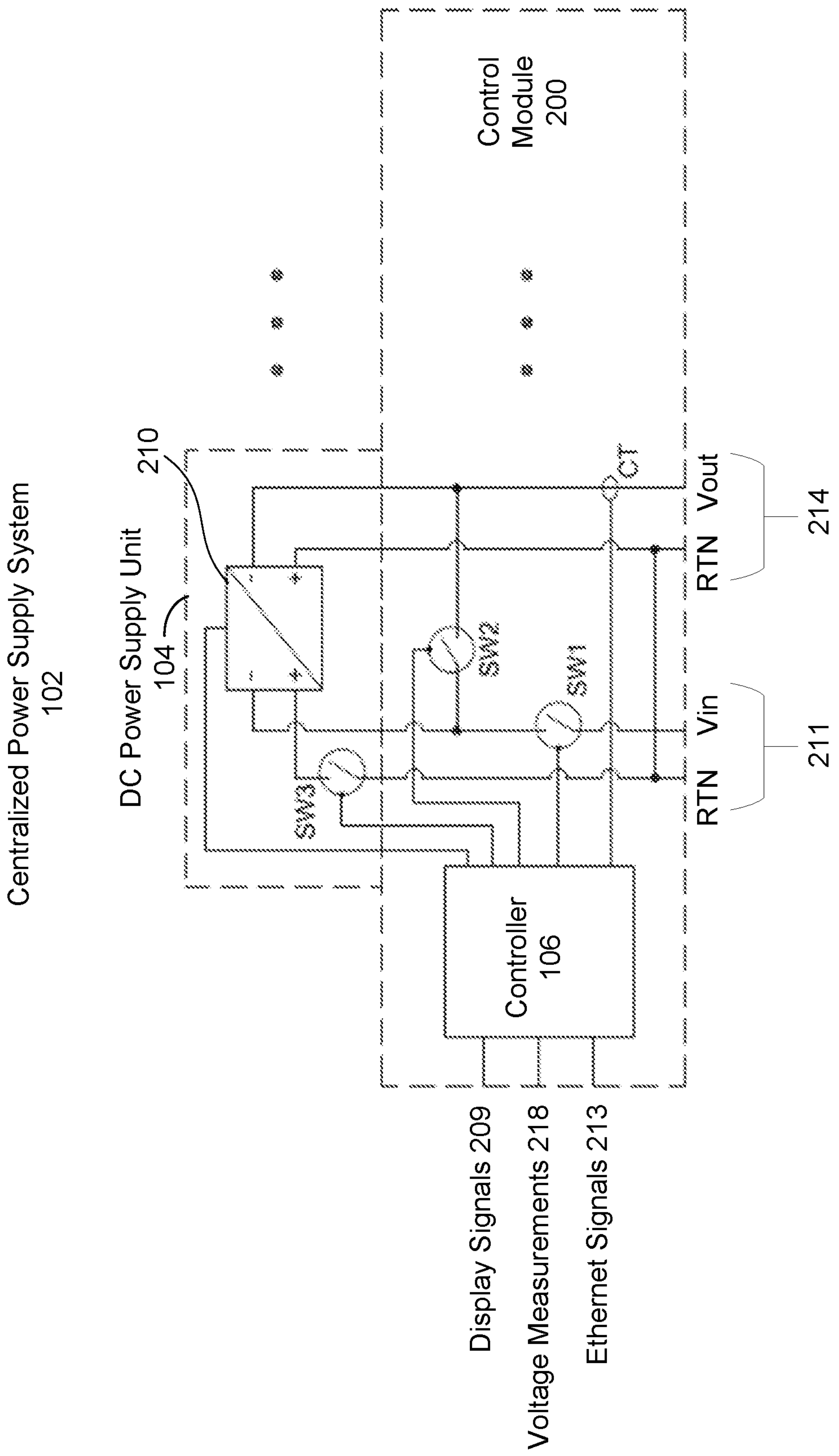
FIG. 2 is a block diagram showing connections of the centralized power supply system and the controller.

FIG. 2 is a block diagram showing connections of the centralized power supply system 202 and the controller 106. The controller 106 is coupled to each of the DC power supply units 104 (only one of which is illustrated here for simplicity). In one embodiment, the controller 106 may be part of a control module that contains power inputs 211 and power outputs 214 for the DC power supply units 104. In another embodiment, the controller 106 may be implemented within the DC power supply unit 104. In addition, the DC power supply unit 104 may comprise a full-scale DC-DC converter 210. In a full-scale converter system, the DC-DC converters 210 convert all of the input power (e.g, an AC power supply) to the output voltage of the centralized power supply system 202 but at a different voltage level. Switch SW1 is used to disconnect input power in cases of overcurrent conditions. SW2 is used to by-pass the DC-DC converter 210. SW1 and SW3 are used to disconnect the DC-DC converter 210 in case of reverse polarity. Finally, the centralized power supply system 102 may also be implemented as an isolated full-scale DC-DC converter when the return (RTN) at power input 211 is NOT connected to the RTN at a power output 214 in the control module 200. In some other embodiments, switches SW3 and/or SW2 might not be used or be present.

The controller 106 may communicate to a user through a display device (not shown) using display signals 209 that provide/display information on settings and status and the alarms of the system and to receive settings information. Settings may include current limit thresholds, and the like. Another function of the control module 200 is to monitor the status and the alarms of the system and then communicate alarm and status information to the operator. This may be accomplished through Ethernet signals 213 (using SNMP protocols) that transfers data to an external device/location. Use of voltage measurements 218 is explained with respect to FIG. 3.

The following are example uses of the automated circuit allocation described above.

Power Supplies for Analog and Digital Front End Electronics

One example use is in the powering particle detectors used in physics experiments. The particle detectors are equipped with built-in electronics, and due to effective miniaturization, more and more components are integrated. One main goal is to have a preprocessing of detector signals as soon as possible in order to reduce the noise contamination and achieve faster data processing. This complex electronics need stable low voltages for analog and digital circuits. However, the geometry, space constraints and often hostile environmental conditions lead to the use of power cables whose length may range from centimeters to several hundreds of meters.

In this system, a multichannel DC power supply may power several remote particle detectors. The input power requirements (for example voltage) of each remote device may differ. The automated circuit allocation method could be used to provide the correct mapping between each output of the power supply and the corresponding remote device. A communication link could be used to connect each of the remote devices with the multichannel power supply, which conveys information about the input voltage of each remote device to the controller of the multichannel power supply. Then, the controller can raise the voltage of each channel independently and one at a time to identify which of the remote device is connected to this output channel of the power supply. This method allows the faster and error-free installation of the power supply system for the remote devices.

Another application of this method is in airplanes that use an electric system for airplane control. In this example, there are several independent power supply units that feed motors located in various locations of the airplane to control the navigation flaps etc., avoiding the use of a hydraulic system. Each of the remote devices in this case (for example motors) may have different power characteristics and a proper matching between the individual power supply unit and the corresponding motor is required. The proper allocation of them has to be checked and also automatically rectified by modifying the power characteristics of the incorrectly connected power supply. A feedback loop may be used that measures a voltage at the input of each of the motors and transmits this information to the controller of the centralized power supply system through a fiber optic link that interconnects all the motor devices. During initialization of the power system, the centralized power supply system sends a voltage pulse that is received and transmitted through the fiber optic link to enable the controller to determine if there is any connectivity issue and change the power characteristics of the power supply to enable proper operation of the system.

Figure 3:
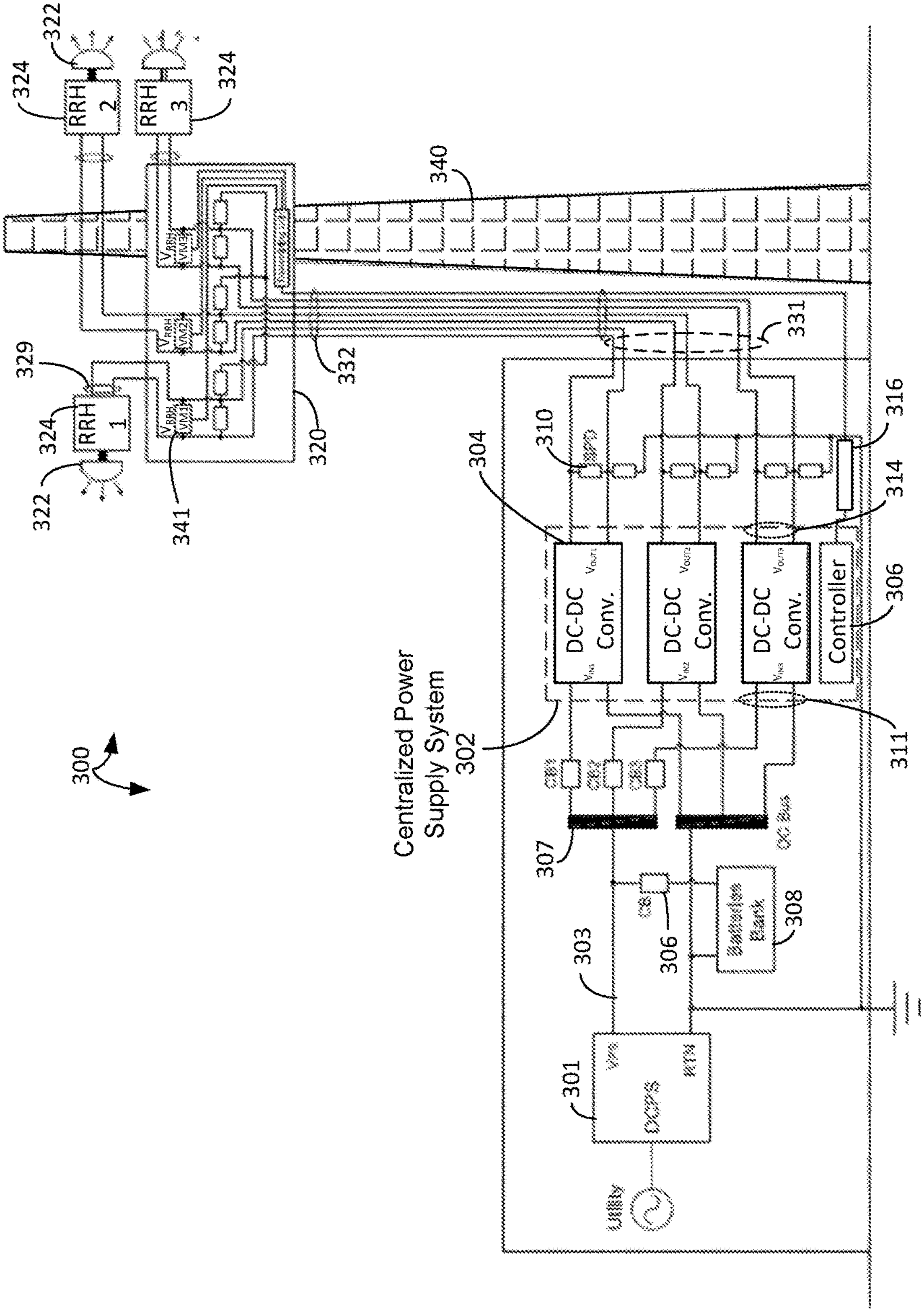
FIG. 3 is a diagram illustrating a telecommunication power system where the remote devices are remote radio heads (RRHs) located on a structure and the centralized power supply system is located at a base of the structure.

Another example is the use of the automated circuit allocation in a telecommunication power system, as shown in FIG. 3.

FIG. 3 is a diagram illustrating a telecommunication power system where the remote devices are remote radio heads (RRHs). The telecommunication communications system 300 includes a base location that may include a DC power supply (DCPS) 301, centralized power supply system 302 is coupled to a first local end of DC power cables 332, and an overvoltage protection (OVP) assembly that includes multiple surge protective devices (SPDs) 310. The top location may include any structure, such as cellular radio tower 340, on which remote radio heads (RRHs) 322 are located and connected to a second top end of DC power cables 332.

The DC power supply (DCPS) 301 converts AC voltage from a power utility into a power input, which includes DC voltage 303. The DC output of DCPS 301 is connected to a DC bus 307, and the DC bus 307 also may be connected to a battery bank 308 through a circuit breaker (CB) 306. Power from DC bus 307 is distributed to one or more DC circuits 331 (e.g., DCC1 to DCC3) that each feed a different RRH 322 through DC cable 332. In some cases, there might be more than three DC circuits, for example, there may be 12 DC circuits 331 or even more. Multiple surge protective devices (SPD) 312 comprising the OVP assembly protects the power communications system 300 from lightning events.

A top OVP unit 320 is located at the top of tower 340 protects RRHs 122 from lightning. DC power jumper cables 329 connect terminals on the top OVP unit 320 for each DC circuit 131 to corresponding RRHs 122. One or more voltage monitoring (VM) devices 341 are installed inside of top OVP unit 320 and are coupled to the top end of DC power cables 132. One or more VM devices 341 are coupled the top end of DC power cables 132 (as part of DC power jumper cables 329 that connect OVP unit 320 to RRHs 122). VM devices 341 measure input voltage 324 (VRRH) at the top of the cellular radio tower 340 and communicate with the controller 306. The VM devices 341 may transmit the measured voltages to the control module through a communication link, such as a RS485. VM devices 341 may use other types of communication links, such as optical fiber lines. In another embodiment, the VM devices 341 may send current pulses over DC power cables 332. DC conductors, DC circuits, and DC cables may be used interchangeably and all refer to electrical conductors used between the DC power supply and RRH units.

In one embodiment, the centralized power supply system 302 is a power conversion system for up to 12 independent DC circuits 331, with a maximum load current of approximately 50 A each, for example. The centralized power supply system 302 includes an input 311 that receives the power input, including an input voltage (VIN) from the DC power supply (DCPS) 301; and an output 314 (VOUT) coupled to a power cable, such as the base end of DC power cables 132. The centralized power supply system 302 may contain one or more DC-DC converters 304, and controller 306 for the power supply and bypass circuitry, as described above. The by-pass circuitry (SW1, SW2, SW3 of FIG. 2) connect the input voltage to the output of the centralized power supply system 302, neutralizing the DC-DC converter(s) 304. This offers continuous power supply to RRHs 122 in case of any failure on the DC-DC converter(s).

The controller 306 may be configured to monitor power information. In one embodiment, the power information may include; the input voltage (VIN), current measurements of the input voltage source (VIN), a voltage measurement at an input to the RRHs 322 from VM device 341, a resistance of the DC cable 132, a target voltage at a power input of the RRHs 322, or a combination thereof. The DC-DC converters 910 are coupled to the control module 904 and are configured to generate an output voltage at the output 914 (VOUT).

The centralized power supply system 302 may be implemented according to several embodiments. In a first embodiment, the centralized power supply system 302 may include one or more modules, each containing multiple DC inputs, and one or more modules containing one or more DC-DC converters 304, which may be coupled to multiple individual DC circuits 331 at the output, as shown in FIG. 9. In a second embodiment, the centralized power supply system 302 may include be implemented with a single DC input and several modules containing one or more DC-DC converters 304, which are connected in parallel at their outputs to provide one output voltage. In a third embodiment, the centralized power supply system 302 may be implemented with a single DC input, one or more modules containing one or more DC-DC converters 304, and multiple individual DC circuits 331 at the output.

Automatic Circuit Allocation

According to the disclosed embodiments, the controller 306 (or another module/circuit) performs automatic DC circuit allocation that maps to respective RRHs 322 to corresponding DC-DC converters 304 and DC circuits 331.

During an initialization phase or at a later time, the centralized power supply system 302 may need to assign the DC-DC converters 204 to corresponding RRHs 322. According to the disclosed embodiments, the centralized power supply system 302 automatically determines a circuit allocation of the individual ones of the DC-DC converters to respective RRHs 322.

In one embodiment, the automatic circuit allocation process uses the voltage information from an input to the RRHs, such as voltage value readings from the voltage meters (VMs) 341 at the top of the tower, voltage pulses, or current pulses. The controller 306 receives the input voltage information from the input to the RRHs and automatically assigns individual ones of the DC-DC converters 204 to respective ones of the RRHs 322 based on the received voltage information to determine a circuit allocation of the individual ones of the DC-DC converters to respective RRHs.

At an initial state, all system circuits are not allocated and are in by-pass mode. Thus, the input voltage of the RRHs 322 will be lower than the output voltage of the centralized power supply system 302 due to a voltage drop across the DC power cables 332.

In one embodiment, the top voltage measurements 218 (FIG. 2) taken by the voltage monitoring (VM) devices 341 may be used. The process may include taking a top voltage measurement to have a reference of the top voltage for each DC circuit 331. In one embodiment, controller 206 starts to allocate the circuits/DC-DC converters 304 one at a time by first increasing an output voltage of a selected DC-DC converter 304. For example, the voltage may be increased from −52V to a static −58V. In case where the system is powered by battery bank 308 (NiCd batteries), the output voltage of the system may be up to −58V and the system increases the output voltage up to −61V during automatic circuit allocation process to improve discrimination. In an alternative embodiment, the controller 206 may increase the output voltage of the DC-DC converters 304 all at once but at difference voltages.

The input voltage of the corresponding RRH 322 increases accordingly and its value depends on the line current of the specific RRH circuit. This voltage value is most probably greater than all the other input voltage values from the remaining RRHs 322. The VM device 341 measures the voltage of each power input to the RRHs 322 and the voltage measurements 218 are collected by a top controller (not shown) that transmits the voltage measurements 218 to the base using the signal wires of the DC power cable 332 (e.g., through an RS485 connection). In one embodiment, the controller 306 may receive the voltage measurements 218 directly or indirectly. For example, the voltage measurements 218 may be received by a module containing the SPDs 310, and then transferred to the controller 306. The voltage measurement system comprises the feedback loop 114 of FIG. 1B used for the automatic circuit allocation.

The controller 306 then monitors which one of the RRHs 322 has an increase in input voltage based on the voltage measurements 218. In one embodiment, the controller 306 may compare all the input voltage values transmitted from the VM devices 341 and stores a circuit ID of the RRH having a highest input voltage value. The controller 306 may also be configured to ensure that the highest input voltage value differs by more than a predetermined value from all the other input voltage values to increase the discrimination. The controller 306, then automatically assigns a correspondence between the DC-DC converter 304 having the increased output voltage and the RRH circuit ID having the increase in input voltage.

This process may be repeated for each of the DC-DC converters 304 until all the system circuits have been allocated. If there are five DC DC converters 304, then eventually there is a group of five stored RRH circuit IDs along with an ID of the allocated DC-DC converter 304.

In another embodiment, the automatic circuit allocation process may use dedicated voltage value transmitters which are located at the top of the tower. The transmitters connect to respective ones of the RRHs, transmit the input voltage from the RRHs, and the corresponding RRH circuit ID over DC power cables. Each system circuit receives the corresponding RRH circuit ID through the DC power cables and performs the allocation. The transmission of the RRH circuits ID over the DC power cables may be performed with current pulses, voltage pulses under amplitude modulation (ASK) or voltage pulses under frequency modulation (FSK). As an example, the controller 206 may instruct the DC-DC converter 304 (one at a time) to generate a pulse on the voltage and waits to receive the top voltage measurements to determine which of RRHs 322 is connected to the specific DC-DC converter 304. The pulse on the voltage may be generated by switching on and off its output. In another embodiment, the DC-DC converter 304 may use a by-pass switch between its input voltage and its output voltage, in case these are different. U.S. Pat. No. 10,812,664 B2, which is herein incorporated by reference, describes in more detail how this type of communication works.

In some embodiments, the automated circuit allocation process takes place at the initialization phase of the DC-DC converters 304 to perform the correct allocation between the DC-DC converters and the RRHs, before the DC-DC converters start to function. This is because the RRHs may be exposed to wrong power characteristics when connected to an improper DC-DC converter.

Embodiments for power transmission system been disclosed for automatic circuit allocation. The present invention has been described in accordance with the embodiments shown, and there could be variations to the embodiments, and any variations would be within the spirit and scope of the present invention. For example, the exemplary embodiment can be implemented using hardware, software, a computer readable medium containing program instructions, or a combination thereof. Accordingly, many modifications may be made by one of ordinary skill in the art without departing from the spirit and scope of the appended claims.

The invention claimed is:

1. A centralized power supply system comprising a controller coupled to a first set of DC power supply units, wherein:

(a) each DC power supply unit of the first set of DC power supply units is configured to be capable of:
 (i) being electrically connected to a respective power cable of a first set of a plurality of power cables;
 (ii) transmitting a power signal to a respective remote device of a first set of a plurality of remote devices via the respective power cable; and
(b) the controller is configured to perform the steps of:
 (i) sending one or more voltage instructions to one or more DC power supply units of the first set of DC power supply units to set a respective predetermined voltage for each of the one or more DC power supply units;
 (ii) sending a first power modification instruction to a first DC power supply unit of the first set of DC power supply units to modify an output voltage of the first DC power supply unit over a first power cable of the first set of the plurality of power cables,
 (iii) receiving a plurality of input voltage values associated with each of the first set of the plurality of remote devices including a first input voltage value associated with a first remote device of the first set of the plurality of remote devices;
 (iv) comparing the respective input voltage value of each remote device of the first set of the plurality of remote devices and determining that the first input voltage value differs by more than a predetermined value from the input voltage value of each other remote device of the first set of the plurality of remote devices; and
 (v) automatically assigning a correspondence between the first DC power supply unit and the first remote device.

2. The centralized power supply system of claim 1, wherein each remote device of the first set of the plurality of remote devices is selected from the group comprising: a sensor, a motor, an internet-of-things device, a radio, a remote radio head, and a remote particle detector.

3. The centralized power supply system of claim 1, wherein at least one remote device of the first set of the plurality of remote devices comprises a remote radio head.

4. The centralized power supply system of claim 1, wherein each DC power supply unit of the first set of DC power supply units comprises a DC-DC converter.

5. The centralized power supply system of claim 1, wherein each DC power supply unit of the first set of DC power supply units comprises an AC-DC converter.

6. The centralized power supply system of claim 1, wherein at least one of the DC power supply units of the first set of DC power supply units is configured to receive power from a battery bank.

7. The centralized power supply system of claim 1, wherein the controller is configured to iterate steps (b)(ii)-(b)(v) for each of the DC powers supply units of the first set of DC power supply units so as to generate a mapping between each DC power supply unit of the first set of DC power supply units and a corresponding remote device of the first set of the plurality of remote devices.

8. The centralized power supply system of claim 1, wherein the plurality of input voltage values is received from a first set of voltage monitoring (VM) devices.

9. The centralized power supply system of claim 1, wherein the plurality of input voltage values is received from a collector.

10. The centralized power supply system of claim 1, wherein the controller is configured to monitor power information, wherein the power information includes one or more of an input voltage, current measurements of an input voltage source, a voltage measurement at an input to the remote device of a first set of a plurality of remote devices from a voltage measurement device, a power cable resistance, a target voltage, or a combination thereof.

11. The centralized power supply system of claim 1, wherein the first power modification instruction is to modify the output voltage of the first DC power supply unit by applying noise to the output voltage.

12. The centralized power supply system of claim 1, wherein the first power modification instruction is to modify the output voltage of the first DC power supply unit by switching on and off the first DC power supply unit.

13. The centralized power supply system of claim 1, wherein the first power modification instruction is to modify the output voltage of the first DC power supply unit by injecting a high frequency signal in the output voltage.

14. The centralized power supply system of claim 1, wherein the first power modification instruction is to modify the output voltage of the first DC power supply unit by applying a voltage pulse to the output voltage.

15. The centralized power supply system of claim 1, wherein the first power modification instruction is to modify the output of the first DC power supply unit by increasing the output voltage.

16. A centralized power supply system comprising a controller coupled to a first set of DC power supply units, wherein:

(a) each DC power supply unit of the first set of DC power supply units is electrically connected to a respective remote device of a first set of remote devices; and
(b) the controller is configured to perform the steps of:
 (i) sending one or more voltage instructions to one or more DC power supply units of the first set of DC power supply units to set a respective predetermined voltage for each of the one or more DC power supply units;
 (ii) sending a first power modification instruction to a first DC power supply unit to modify an output voltage of the first DC power supply unit;
 (iii) receiving a plurality of input voltage values associated with each of the first set of remote devices including a first input voltage value associated with a first remote device of the first set of remote devices;
 (iv) comparing the respective input voltage value of each remote device of the first set of remote devices and determining that the first input voltage value differs by more than a predetermined value from the input voltage value of each other remote device of the first set of remote devices; and
 (v) automatically assigning a correspondence between the first DC power supply unit and the first remote device.

17. The centralized power supply system of claim 16, wherein each remote device of the first set of remote devices is selected from the group comprising: a sensor, a motor, an internet-of-things device, a radio, a remote radio head, and a remote particle detector.

18. The centralized power supply system of claim 16, wherein at least one remote device of the first set of remote devices comprises a remote radio head.

19. The centralized power supply system of claim 16, wherein each DC power supply unit of the first set of DC power supply units comprises a DC-DC converter.

20. The centralized power supply system of claim 16, wherein each DC power supply unit of the first set of DC power supply units comprises an AC-DC converter.

21. The centralized power supply system of claim 16, wherein at least one of the DC power supply units of the first set of DC power supply units is configured to receive power from a battery bank.

22. The centralized power supply system of claim 16, wherein the controller is configured to iterate steps (b)(ii)-(b)(v) for each of the DC powers supply units of the first set of DC power supply units so as to generate a mapping between each DC power supply unit of the first set of DC power supply units and a corresponding remote device of the first set of remote devices.

23. The centralized power supply system of claim 16, wherein the plurality of input voltage values is received from a first set of voltage monitoring (VM) devices.

24. The centralized power supply system of claim 16, wherein the plurality of input voltage values is received from a collector.

25. The centralized power supply system of claim 16, wherein the controller is configured to monitor power information, wherein the power information includes one or more of an input voltage, current measurements of an input voltage source, a voltage measurement at an input to the remote device of a first set of a plurality of remote devices from a voltage measurement device, a power cable resistance, a target voltage, or a combination thereof.

26. The centralized power supply system of claim 16, wherein the first power modification instruction is to modify the output voltage of the first DC power supply unit by applying noise to the output voltage.

27. The centralized power supply system of claim 16, wherein the first power modification instruction is to modify the output voltage of the first DC power supply unit by switching on and off the first DC power supply unit.

28. The centralized power supply system of claim 16, wherein the first power modification instruction is to modify the output voltage of the first DC power supply unit by injecting a high frequency signal in the output voltage.

29. The centralized power supply system of claim 1, wherein the first power modification instruction is to modify the output voltage of the first DC power supply unit by applying a voltage pulse to the output voltage.

30. The centralized power supply system of claim 1, wherein the first power modification instruction is to modify the output voltage of the first DC power supply unit by increasing the output voltage.

* * * * *